(12) United States Patent
Pappas et al.

(10) Patent No.: US 6,582,882 B2
(45) Date of Patent: Jun. 24, 2003

(54) IMAGEABLE ELEMENT COMPRISING GRAFT POLYMER

(75) Inventors: S. Peter Pappas, Juno Beach, FL (US); Shashikant Saraiya, Parlin, NJ (US)

(73) Assignee: Kodak Polychrome Graphics LLC, Norwalk, CT (US)

(*) Notice: Subject to any disclaimer, the term of this patent is extended or adjusted under 35 U.S.C. 154(b) by 83 days.

(21) Appl. No.: 09/826,300

(22) Filed: Apr. 4, 2001

(65) Prior Publication Data

US 2002/0155375 A1 Oct. 24, 2002

(51) Int. Cl.$^7$ .............. G03C 1/76; G03C 1/74; G03C 1/72; G03F 7/038; G03F 7/30

(52) U.S. Cl. ............ 430/271.1; 430/270.1; 430/273.1; 430/325; 430/302; 430/330; 430/331; 430/328; 430/905; 430/906; 430/907; 430/910; 430/944; 430/945

(58) Field of Search ............. 430/271.1, 270.1, 430/273.1, 905, 906, 910, 325, 330, 331, 328, 907, 944, 945, 302

(56) References Cited

U.S. PATENT DOCUMENTS

| | | | |
|---|---|---|---|
| 5,948,599 A | 9/1999 | Gardner et al. | 430/330 |
| 6,022,667 A | 2/2000 | Vermeersch et al. | 430/271.1 |
| 6,071,369 A | 6/2000 | Vermeersch et al. | 156/272.8 |

FOREIGN PATENT DOCUMENTS

| | | |
|---|---|---|
| DE | 41 08 496 A1 | 10/1991 |
| EP | 0 510 646 A1 | 10/1992 |
| EP | 0514145 A1 | 11/1992 |
| EP | 0599510 A2 | 6/1994 |
| EP | 0816070 A1 | 1/1998 |
| EP | 0839647 A1 | 5/1998 |
| EP | 0881096 A1 | 12/1998 |
| JP | 60068992 | 4/1985 |
| JP | 2-277695 | * 11/1990 |
| WO | WO 99/67097 | 12/1999 |

OTHER PUBLICATIONS

English Translation of JP 2–277695 (Toshiaki et al.), Nov. 14, 1990.*

English Abstract for JP 2–277695, Provided by Derwent (Access No.: 1991–002288), 1990.*

Guo et al, *Effects of Salt on the Intrinsic Viscosity of Model Alkali–Soluble Associative Polymers*, Macromolecular Chemistry and Physics, 199 (6), p. 1175–1184, 1998.*

* cited by examiner

Primary Examiner—Rosemary Ashton
Assistant Examiner—Sin J. Lee
(74) Attorney, Agent, or Firm—Faegre & Benson LLP

(57) ABSTRACT

The present invention includes an imageable element, comprising a substrate and a thermally imageable composition which includes a graft copolymer having hydrophobic and hydrophilic segments. Upon imagewise exposure to thermal energy, the graft copolymer produces exposed regions that are less soluble in a developer than the unexposed regions. Also included is a method of producing an imaged element which includes a graft copolymer according to the present invention.

30 Claims, No Drawings

IMAGEABLE ELEMENT COMPRISING GRAFT POLYMER

BACKGROUND OF THE INVENTION

1. Field of the Invention

The present invention relates to an imageable element comprising a graft copolymer having hydrophilic and hydrophobic segments. More particularly, the present invention relates to a graft copolymer, which upon imagewise exposure to thermal energy, produces exposed regions that are less soluble in a developer than the unexposed regions.

2. Description of the Prior Art

Thermally imageable compositions employing hydrophobic heat sensitive polymer particles dispersed in hydrophilic binders are generally known in the art.

JP 60/68992 and EP 514 145 disclose the use of core-shell particles in a thermally imageable composition that can undergo at least partial thermal coalescence.

EP 599 510 and equivalent U.S. Pat. No. 5,948,599 disclose a method of forming an image using a radiation sensitive plate, which comprises a layer which includes (1) a reactive group that undergoes insolubilization at elevated temperature and/or exposure to radiation, and (2) a substance capable of strongly absorbing radiation to produce heat. The layer contains a disperse phase, which has a heat softenable component and a binder or continuous phase that has a component that is soluble or swellable in an aqueous medium. Radiation causes at least partial coalescence in the exposed regions. Following development, the plate is heated or irradiated to effect insolubilization of the image areas by reaction of the reactive groups.

EP 816 070 discloses hydrophobic thermoplastic particles, photothermal converter and a covering layer.

U.S. Pat. No. 6,071,369 and EP 839 647 disclose a method for imagewise exposing an image forming layer that has thermoplastic hydrophobic polymer particles in a hydrophilic binder. Laser exposure is limited to a pixel dwell time of 0.1 to 50 microseconds.

U.S. Pat. No. 6,022,667 and EP 881 096 disclose an imageable layer comprising a hydrophobic thermoplastic polymer latex and a photothermal converter. These references require the use of an alkali soluble intermediate layer between the substrate and the imageable layer.

None of the prior art discloses heat sensitive graft copolymers of the present invention.

SUMMARY OF THE INVENTION

In broad concept, the present invention includes an imageable element comprising a substrate and a thermally imageable composition coated on a surface of the substrate, wherein the thermally imageable composition comprises a graft polymer having hydrophilic and hydrophobic segments. The imageable element according to the present invention is thermally imageable.

The present invention includes an imageable element comprising: a substrate; and a thermally imageable composition coated on a surface of the substrate; wherein the thermally imageable composition comprises a graft copolymer having a hydrophobic polymer backbone and a plurality of pendant groups represented by the formula:

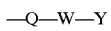

wherein Q is a difunctional connecting group; W is selected from the group consisting of: a hydrophilic segment and a hydrophobic segment; Y is selected from the group consisting of: a hydrophilic segment and a hydrophobic segment; with the proviso that when W is a hydrophilic segment, Y is selected from the group consisting of: a hydrophilic segment and a hydrophobic segment, with the further proviso that when W is hydrophobic, Y is a hydrophilic segment.

The present invention also includes a method of producing an imaged element. The method comprises the steps of:
providing an imageable element comprising: a substrate; and a thermally imageable composition coated on a surface of the substrate; the thermally imageable composition comprising a graft copolymer having a hydrophobic polymer backbone and a plurality of pendant groups represented by the formula:

wherein Q is a difunctional connecting group; W is selected from the group consisting of: a hydrophilic segment and a hydrophobic segment; Y is selected from the group consisting of: a hydrophilic segment and a hydrophobic segment; with the proviso that when W is a hydrophilic segment, Y is selected from the group consisting of: a hydrophilic segment and a hydrophobic segment, with the further proviso that when W is hydrophobic, Y is a hydrophilic segment;
imagewise exposing the imageable element to thermal radiation to produce exposed and unexposed regions; and
contacting the imagewise exposed imageable element and a developer to remove the unexposed regions and thereby produce the imaged element.

The present invention also includes a thermally imageable composition comprising a graft copolymer having a hydrophobic polymer backbone and a plurality of pendant groups represented by the formula:

wherein Q is a difunctional connecting group; W is selected from the group consisting of: a hydrophilic segment and a hydrophobic segment; Y is selected from the group consisting of: a hydrophilic segment and a hydrophobic segment; with the proviso that when W is a hydrophilic segment, Y is selected from the group consisting of: a hydrophilic segment and a hydrophobic segment, with the further proviso that when W is hydrophobic, Y is a hydrophilic segment.

The graft copolymers of present invention can be imaged without a binder. Furthermore, the thermally imageable compositions can be imaged and developed without the need of an intermediate pre-heat step. In addition, the present invention does not require the use of an intermediate barrier or a covering layer.

The present invention provides a thermally imageable composition that is useful in thermal imaging of, for example, lithographic plates and printed circuit boards.

DETAILED DESCRIPTION OF THE INVENTION

Lithographic printing is based on the immiscibility of oil and water. Ink receptive areas are generated on the surface of a hydrophilic surface. When the surface is moistened with water and then ink is applied, the hydrophilic background areas retain the water and repel the ink. The ink receptive areas accept the ink and repel the water. The ink is transferred to the surface of a material upon which the image is to be reproduced. Typically, the ink is first transferred to an intermediate blanket, which in turn transfers the ink to the surface of the material upon which the image is thereafter reproduced.

Lithographic printing plate precursors, i.e., imageable elements, typically include a radiation-sensitive coating applied over the hydrophilic surface of a support material. If after imagewise exposure to radiation, the exposed regions of the coating become the ink-receptive image regions, the plate is called a negative-working printing plate. Conversely, if the unexposed regions of the coating become the ink-receptive image regions, the plate is called a positive-working plate. In the present invention, the imagewise exposed regions are rendered less soluble or dispersible in a developer and become the ink-receptive image areas. The unexposed regions, being more readily soluble or dispersible in the developer, are removed in the development process, thereby revealing a hydrophilic surface, which readily accepts water and becomes the ink-repellant non-image area.

The present invention includes a thermally imageable composition comprising a graft copolymer, preferably a thermally sensitive graft copolymer, having hydrophobic and hydrophilic segments. The thermally imageable composition comprises a graft copolymer having, preferably, a hydrophobic polymer backbone and a plurality of pendant groups represented by the formula:

—Q—W—Y wherein Q is a difunctional connecting group;
W is selected from the group consisting of: a hydrophilic segment and a hydrophobic segment;
Y is selected from the group consisting of: a hydrophilic segment and a hydrophobic segment;
with the proviso that when W is a hydrophilic segment, Y is selected from the group consisting of: a hydrophilic segment and a hydrophobic segment, with the further proviso that when W is hydrophobic, Y is a hydrophilic segment.

The term "graft" polymer or copolymer in the context of the present invention refers to a polymer which has as a side chain a group having a molecular weight of at least 200. Such graft copolymers can be obtained, for example, by anionic, cationic, non-ionic, or free radical grafting methods, or they can be obtained by polymerizing or co-polymerizing monomers, which contain such groups.

The term "polymer" in the context of the present invention refers to high and low molecular weight polymers, including oligomers, and includes homopolymers and copolymers. The term "copolymer" refers to polymers that are derived from two or more different monomers.

The term "backbone" in the context of the present invention refers to the chain of atoms in a polymer to which a plurality of pendant groups are attached. An example of such a backbone is an "all carbon" backbone obtained from the polymerization of an olefinically unsaturated monomer.

The term "hydrocarbyl" in the context of the present invention refers to a linear, branched or cyclic alkyl, alkenyl, aryl, aralkyl or alkaryl of 1 to 120 carbon atoms, and substituted derivatives thereof. The substituent group can be halogen, hydroxy, acyloxy, hydrocarbyloxy, carboxyl, ester, ketone, cyano, amino, amido and nitro groups. Hydrocarbyl groups in which the carbon chain is interrupted by oxygen, nitrogen or sulfur are also included in the term "hydrocarbyl".

The term "hydrocarbylene" in the context of the present invention refers to a linear, branched or cyclic alkylene, vinylene, arylene, aralkylene or alkarylene of 1 to 120 carbon atoms, and substituted derivatives thereof. The substituent group can be halogen, hydroxy, acyloxy, hydrocarbyloxy, carboxyl, ester, ketone, cyano, amino, amido and nitro groups. Hydrocarbylene groups in which the carbon chain is interrupted by oxygen, nitrogen or sulfur are also included in the term "hydrocarbylene".

The present invention includes a graft copolymer comprising repeating units represented by the formula:

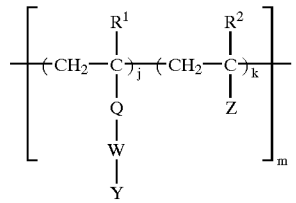

wherein each of $R^1$ and $R^2$ is independently selected from the group consisting of: H, alkyl, aryl, aralkyl, alkaryl, $COOR^5$, $R^6CO$, halogen and cyano;
Q is selected from the group consisting of:

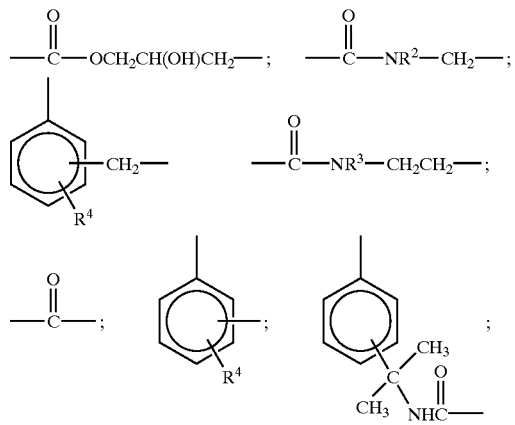

wherein $R^3$ is selected from the group consisting of: H and alkyl; $R^4$ is selected from the group consisting of: H, alkyl, halogen, cyano, nitro, alkoxy, alkoxycarbonyl, acyl and a combination thereof;
W is selected from the group consisting of: a hydrophilic segment and a hydrophobic segment;
Y is selected from the group consisting of: a hydrophilic segment and a hydrophobic segment;
Z is selected from the group consisting of: H, alkyl, halogen, cyano, acyloxy, alkoxy, alkoxycarbonyl, hydroxyalkyloxycarbonyl, acyl, aminocarbonyl, aryl and substituted aryl;
j is at least 1;
k is at least 1; and
m is at least 2;
with the proviso that when W is a hydrophilic segment, Y is selected from the group consisting of: a hydrophilic segment and a hydrophobic segment, with the further proviso that when W is hydrophobic, Y is a hydrophilic segment.

In one embodiment, the preferred graft copolymer of the present invention comprises main chain segments that are predominately hydrophobic and branch segments that are predominately hydrophilic.

In a second embodiment, the preferred graft copolymer comprises main chain segments that are predominately hydrophobic and branch segments comprising both hydrophobic and hydrophilic segments.

The hydrophilic segment in W in the graft copolymer of the present invention is preferably a segment represented by the formula:

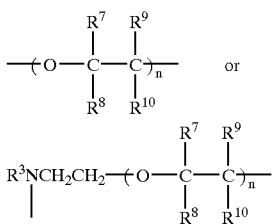

wherein each of $R^7$, $R^8$, $R^9$ and $R^{10}$ can independently be H or methyl; $R^3$ can be H or alkyl; and the hydrophobic segment in W can be —$R^{12}$—, —O—$R^{12}$—O—, —$R^3$N—$R^{12}$—$NR^3$—, —OOC—$R^{12}$—O— or —OOC—$R^{12}$—O—, wherein each $R^{12}$ can independently be a linear, branched or cyclic alkylene of 6–120 carbon atoms, a haloalkylene of 6–120 carbon atoms, an arylene of 6–120 carbon atoms, an alkarylene of 6–120 carbon atoms or an aralkylene of 6–120 carbon atoms; and $R^3$ can be H or alkyl; and wherein the hydrophilic segment in Y can be H, $R^{15}$, OH, $OR^{16}$, COOH, $COOR^{16}$, $O_2CR^{16}$, a segment represented by the formula:

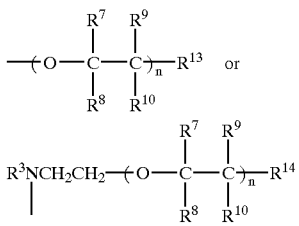

wherein each of $R^7$, $R^8$, $R^9$ and $R^{10}$ can independently be H and methyl; $R^3$ can be H or alkyl; wherein each $R^{13}$, $R^{14}$, $R^{15}$ and $R^{16}$ can independently be H or alkyl of 1–5 carbon atoms and wherein the hydrophobic segment can be a linear, branched or cyclic alkyl of 6–120 carbon atoms, a haloalkyl of 6–120 carbon atoms, an aryl of 6–120 carbon atoms, an alkaryl of 6–120 carbon atoms, an aralkyl of 6–120 carbon atoms, $OR^{17}$, $COOR^{17}$ or $O_2CR^{17}$, wherein $R^{17}$ is an alkyl of 6–20 carbon atoms; and wherein n is from about 5 to about 250.

In a preferred embodiment, the graft copolymer comprises repeating units represented by the formula:

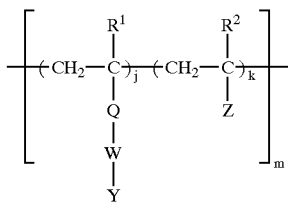

wherein each of $R^1$ and $R^2$ can independently be H, alkyl, aryl, aralkyl, alkaryl, $COOR^5$, $R^6CO$, halogen or cyano.

Q can be one of:

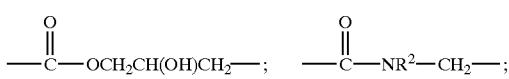

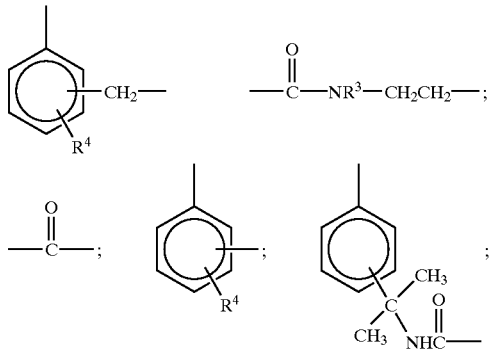

wherein $R^3$ can be H or alkyl; $R^4$ can independently be H, alkyl, halogen, cyano, nitro, alkoxy, alkoxycarbonyl, acyl or a combination thereof.

The segment W can be a hydrophilic segment or a hydrophobic segment, wherein the hydrophilic segment can be a segment represented by the formula:

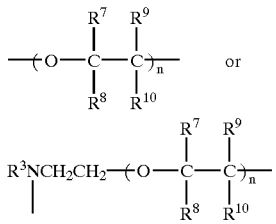

wherein each of $R^7$, $R^8$, $R^9$ and $R^{10}$ can independently be H or methyl; $R^3$ can be H and alkyl; and wherein the hydrophobic segment can be —$R^{12}$—, —O—$R^{12}$—O—, —$R^3$N—$R^{12}$—$NR^3$—, —OOC—$R^{12}$—O— or —OOC—$R^{12}$—O—, wherein each $R^{12}$ can independently be a linear, branched or cyclic alkylene of 6–120 carbon atoms, a haloalkylene of 6–120 carbon atoms, an arylene of 6–120 carbon atoms, an alkarylene of 6–120 carbon atoms or an aralkylene of 6–120 carbon atoms; $R^3$ can be H or alkyl.

Y can be a hydrophilic segment or a hydrophobic segment, wherein the hydrophilic segment can be H, $R^{15}$, OH, $OR^{16}$, COOH, $COOR^{16}$, $O_2CR^{16}$, a segment represented by the formula:

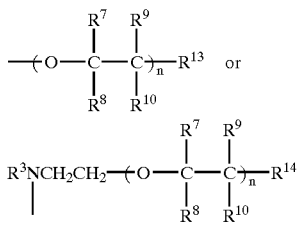

wherein each of $R^7$, $R^8$, $R^9$ and $R^{10}$ can independently be H or methyl; $R^3$ can be H and alkyl; wherein each $R^{13}$, $R^{14}$, $R^{15}$ and $R^{16}$ can be H or alkyl of 1–5 carbon atoms and wherein the hydrophobic segment can be a linear, branched or cyclic alkyl of 6–120 carbon atoms, a haloalkyl of 6–120 carbon atoms, an aryl of 6–120 carbon atoms, an alkaryl of 6–120 carbon atoms, an aralkyl of 6–120 carbon atoms, $OR^{17}$, $COOR^{17}$ or $O_2CR^{17}$, wherein $R^{17}$ can be an alkyl of 6–20 carbon atoms.

Z can be H, alkyl, halogen, cyano, acyloxy, alkoxy, alkoxycarbonyl, hydroxyalkyloxycarbonyl, acyl, aminocarbonyl, aryl and substituted aryl;

j is at least 1;

k is at least 1;

m is at least 2; and n is from about 5 to about 250; with the proviso that when W is a hydrophilic segment, Y is a hydrophilic segment or a hydrophobic segment, with the further proviso that when W is hydrophobic, Y is a hydrophilic segment. The substituent in the above substituted aryl can be alkyl, halogen, cyano, alkoxy or alkoxycarbonyl. Preferably, the alkyl group is an alkyl of 1 to 22 carbon atoms.

In another preferred embodiment, the segment W-Y can be represented by the formula:

wherein n is from about 10 to about 75. In this preferred embodiment, the graft copolymer has, for example, repeating units represented by the formula:

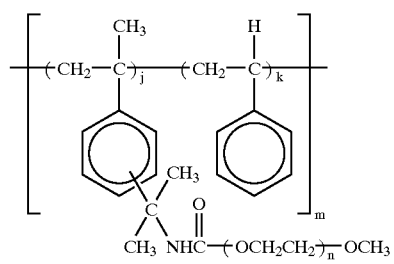

wherein j and k are each at least 1; m is at least 5; and n is from about 10 to about 75. More preferably, n has an average value of about 45.

In another preferred embodiment, the graft copolymer comprises repeating units represented by the formula:

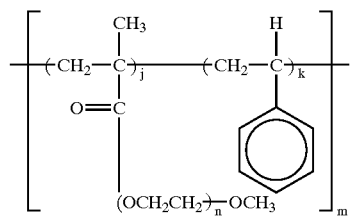

wherein j and k are each at least 1; m is at least 5; and n is from about 10 to about 75, more preferably, n has an average value of about 45.

The graft copolymer having hydrophobic and/or hydrophilic segments is prepared by process comprising the steps of: contacting, in the presence of a catalyst:

(i) a compound represented by the formula:

wherein W is selected from the group consisting of: a hydrophilic segment and a hydrophobic segment and Y is selected from the group consisting of: a hydrophilic segment and a hydrophobic segment, with the proviso that when W is a hydrophilic segment, Y is selected from the group consisting of: a hydrophilic segment and a hydrophobic segment, with the further proviso that when W is hydrophobic, Y is a hydrophilic segment; and (ii) a polymerizable monomer selected from the group consisting of compounds represented by the formula:

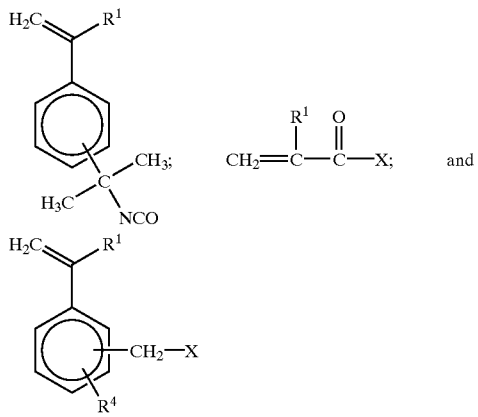

wherein each $R^1$ is independently selected from the group consisting of: H, alkyl, aryl, aralkyl, alkaryl, $COOR^5$, $R^6CO$, halogen and cyano; $R^4$ is selected from the group consisting of: H, alkyl, halogen, cyano, nitro, alkoxy, alkoxycarbonyl, acyl and a combination thereof; and X is glycidyloxy or a leaving group selected from the group consisting of: halogen, alkoxy or aryloxy, to produce a polymerizable graft monomer; and copolymerizing the polymerizable graft monomer and one or more comonomers at a temperature and for a period of time sufficient to produce the graft copolymer.

Preferably, the comonomer is one or more of the following: styrene, substituted styrene, alpha-methylstyrene, acrylate ester, methacrylate ester, acrylonitrile, acrylamide, methacrylamide, vinyl halide, vinyl ester, vinyl ether and an alpha-olefin.

The preferred polymerizable monomer can be any monomer that is capable of reacting with H—W—Y and include polymerizable monomers, such as, m-isopropenyl-α, α-dimethylbenzyl isocyanate, acryloyl chloride and methacryloyl chloride. The reaction is typically carried out in the presence of a catalyst, which is preferably a base, a tin compound or a mixture thereof. In a reaction that admits to an acid catalyst, an acid catalyst such as a Lewis or protic acid may be used.

Preferably, the compounds represented by the formula H—W—Y can be one or more of compounds represented by the formula:

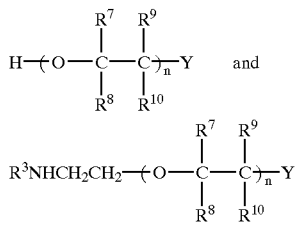

wherein each of $R^7$, $R^8$, $R^9$ and $R^{10}$ can independently be H or methyl; $R^3$ can be H or alkyl; Y can be alkyl, acyloxy, alkoxy or carboxylate; and n is from about 5 to about 250.

The graft copolymer is typically obtained by a free-radical copolymerization of the graft monomer and the comonomer, preferably at a comonomer to graft monomer weight ratio of from about about 99:1 to about 45:55.

Alternatively, the graft copolymer can be prepared by first copolymerizing a polymerizable monomer according to the present invention with one or more comonomers at a temperature and for a period of time sufficient to produce a graftable copolymer and thereafter grafting the group —W—Y onto the graftable copolymer. Such grafting can be achieved by contacting in the presence of a catalyst the above graftable copolymer and a compound represented by the formula:

wherein W can be a hydrophilic segment or a hydrophobic segment and Y can be a hydrophilic segment and a hydrophobic segment, with the proviso that when W is a hydrophilic segment, Y is either a hydrophilic segment or a hydrophobic segment, with the further proviso that when W is hydrophobic, Y is a hydrophilic segment.

Preferably, the graft copolymer has Number Average Molecular Weight of the graft copolymer is from about 2,000 to about 2,000,000 and a glass transition temperature of at least 40° C., more preferably, the graft copolymer has a glass transition temperature of from about 50° C. to about 150° C.

In a preferred embodiment, the present invention also includes a thermally imageable composition comprising a graft copolymer comprising repeating units represented by the formula:

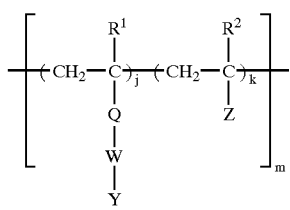

wherein each of $R^1$ and $R^2$ is independently selected from the group consisting of: H, alkyl, aryl, aralkyl, alkaryl, $COOR^5$, $R^6CO$, halogen and cyano;

Q is selected from the group consisting of:

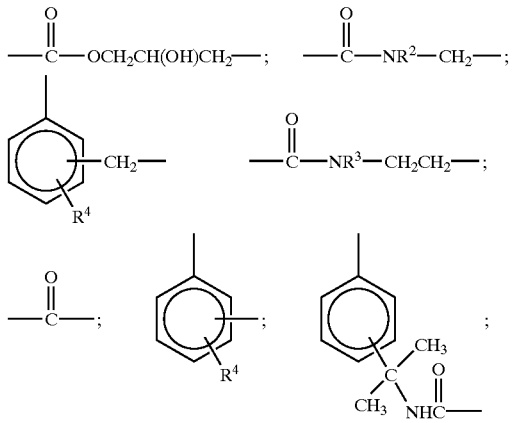

wherein $R^3$ is selected from the group consisting of: H and alkyl; $R^4$ is selected from the group consisting of: H, alkyl, halogen, cyano, nitro, alkoxy, alkoxycarbonyl, acyl and a combination thereof;

W is selected from the group consisting of: a hydrophilic segment and a hydrophobic segment;

Y is selected from the group consisting of: a hydrophilic segment and a hydrophobic segment;

Z is selected from the group consisting of: H, alkyl, halogen, cyano, acyloxy, alkoxy, alkoxycarbonyl, hydroxyalkyloxycarbonyl, acyl, aminocarbonyl, aryl and substituted aryl;

j is at least 1;

k is at least 1; and m is at least 2;

with the proviso that when W is a hydrophilic segment, Y is selected from the group consisting of: a hydrophilic segment and a hydrophobic segment, with the further proviso that when W is hydrophobic, Y is a hydrophilic segment.

The thermally imageable composition comprising the above described graft copolymer according to the present invention can be used in imaging applications with or without the use of a separate binder, i.e., a binder is not essential, so that the thermal imaging can be carried out without a binder. However, the thermal imaging process may be facilitated by the use of a binder. Accordingly, the thermally imageable composition of the present invention can further comprise a binder.

The present invention is useful in negative-working printing plates. Preferably, imaging is carried out using an infrared laser and a photothermal converter for converting IR radiation into heat. However, UV and visible laser imaging may also be used together with an appropriate photothermal converter. Accordingly, the thermally imageable composition of the present invention can further comprise a photothermal converter material, i.e., a material that is capable of converting electromagnetic radiation into heat.

The present invention further includes an imageable element and a method of producing an imaged element using the imageable element. In a preferred embodiment, the imageable element comprises a substrate; and a thermally imageable composition coated on a surface of the substrate; wherein the thermally imageable composition comprises a graft copolymer comprising repeating units represented by the formula:

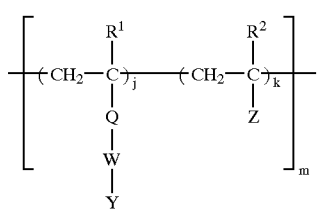

wherein each of $R^1$ and $R^2$ is independently selected from the group consisting of: H, alkyl, aryl, aralkyl, alkaryl, $COOR^5$, $R^6CO$, halogen and cyano;

Q is selected from the group consisting of:

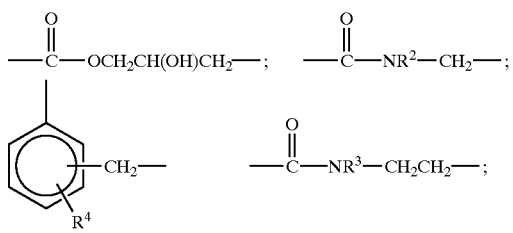

-continued

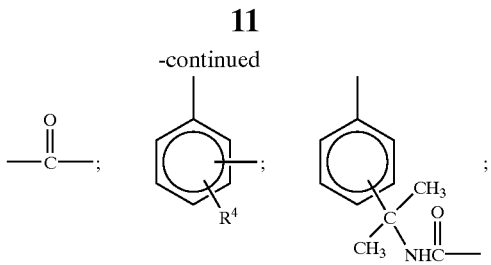

wherein $R^3$ is selected from the group consisting of: H and alkyl; $R^4$ is selected from the group consisting of: H, alkyl, halogen, cyano, nitro, alkoxy, alkoxycarbonyl, acyl and a combination thereof;

W is selected from the group consisting of: a hydrophilic segment and a hydrophobic segment;

Y is selected from the group consisting of: a hydrophilic segment and a hydrophobic segment;

Z is selected from the group consisting of: H, alkyl, halogen, cyano, acyloxy, alkoxy, alkoxycarbonyl, hydroxyalkyloxycarbonyl, acyl, aminocarbonyl, aryl and substituted aryl;

is at least 1;

k is at least 1; and m is at least 2;

with the proviso that when W is a hydrophilic segment, Y is selected from the group consisting of: a hydrophilic segment and a hydrophobic segment, with the further proviso that when W is hydrophobic, Y is a hydrophilic segment.

The substrate of the imageable element is typically an aluminum sheet. However, other materials that are commonly known to those skilled in the art can also be used. Suitable substrates include any sheet material conventionally used to prepare lithographic printing plates, including metals such as aluminum sheets; paper; paper coated on one or both sides with an .alpha.-olefin polymer such as polyethylene; films such as cellulose acetate film, polyvinyl acetal film, polystyrene film polypropylene film, polyester film such as polyethylene terephthalate film, polyamide film, polyimide film, nitrocellulose film, polycarbonate film, polyvinylchloride film; composite films such as polyester, polypropylene or polystyrene film coated with polyethylene film; metalized paper or films; metal/paper laminates and the like.

The surface of plastic films may be treated using the surface treatment techniques known in the art to improve adhesion between the substrate and organic coatings.

A preferred substrate is an aluminum sheet. The surface of the aluminum sheet may be treated with metal finishing techniques known in the art including physical roughening, electrochemical roughening, chemical roughening, anodizing, and silicate sealing and the like. If the surface is roughened, the average roughness (Ra) is preferably in the range from 0.1 to 0.8 μm, and more preferably in the range from about 0.1 to about 0.4 μm. The preferred thickness of the aluminum sheet is in the range from about 0.005 inch to about 0.020 inch.

The preferred substrate is electrochemically-grained and anodized aluminum, such as commonly used for lithographic printing plates.

Anodic pore size for sulfuric acid anodization is typically less than 20 nm whereas anodic pore size for phosphoric acid anodization is typically greater than 30 nm. The use of large anodic pore substrates that are phosphoric acid anodized is preferred over sulfuric acid-anodized substrates.

Other conventional anodization methods can also be used in the preparation of the anodized substrate of the present invention, including particularly those that produce an anodic pore size larger than anodic pore size produced by sulfuric acid anodization.

The graft copolymer can be applied onto the substrate as a solution or dispersion in the coating liquid of the image-forming layer by a suitable coating method. Illustrative of such a method is dissolving the graft copolymer in an organic water immiscible solvent, dispersing the resulting solution in an aqueous medium, applying the resulting dispersion onto a substrate and thereafter removing the solvent by evaporation. After proper drying, the coating weight of the layer is preferably in the range of about 0.2 to about 5.0 $g/m^2$, and more preferably in the range from about 0.7 to about 2.5 $g/m^2$.

The amount of the graft copolymer in the image-forming layer is preferably at least 30% by weight and more preferably at least 45% by weight and most preferably at least 60% by weight.

The photothermal converter material is preferably included in the image-forming layer but can also be provided in a layer adjacent to the image-forming layer. Suitable compounds capable of converting light into heat are preferably infrared absorbing components. Particularly useful photothermal converters are infrared absorbing dyes and pigments. Classes of materials that are useful as photothermal converters include, but are not limited to, squarylium, croconate, cyanine (including phthalocyanine), merocyanine, chalcogenopyryloarylidene, bis (chalcogenopyrylo) polymethine, oxyindolizine, quinoid, indolizine, pyrylium and metal thiolene dyes or pigments. Other useful classes include thiazine, azulenium and xanthene dyes. Still other useful classes are carbon blacks, metal carbides, borides, nitrides, carbonitrides and bronze-structured oxides. Particularly useful as photothermal converters are infrared absorbing dyes of the cyanine class.

The amount of infrared absorbing compound in the image forming layer is generally sufficient to provide an optical density of at least 0.5 and, preferably, an optical density of from about 1 to about 3 in the layer. This range would accommodate a wide variety of compounds having different extinction coefficients. Generally, the amount of infrared absorbing compound in the image forming layer is at least 1 weight percent and, preferably, it is from about 5 to about 30 weight percent.

The method of producing an imaged element comprises the steps of:

providing an imageable element comprising a substrate and a thermally imageable composition comprising a graft copolymer according to the present invention coated on a surface of the substrate;

imagewise exposing the imageable element to thermal radiation to produce exposed and unexposed regions; and contacting the imagewise exposed imageable element and a developer to remove the unexposed regions and thereby produce the imaged element.

Imagewise exposure of the graft copolymer to thermal energy renders the exposed regions less soluble in a developer, which is preferably an aqueous developer. The imageable element according to the present invention is thermally imageable and becomes less soluble in a developer upon exposure to thermal radiation.

Without being bound by theory, it is believed that heating the graft copolymers of the present invention, which contain both hydrophobic and hydrophilic segments, causes realignment of the ink-receptive hydrophobic segments such that the hydrophobic segments are exposed to the coating surface.

Such realignment of the ink-receptive hydrophobic segments is possible because exposure to heat would cause a heat-softening of the graft copolymer, which facilitates mobility of the ink-receptive hydrophobic segments to the coating surface. Such a realignment of the hydrophobic segments would also be facilitated by the generally lower surface energies of the hydrophobic segments than those of the hydrophilic segments.

Realignment of the hydrophobic segments on the surface of the coating reduces the solubility of the thermally exposed regions in the aqueous developer and thereby provides an ink-receptive image area in the exposed areas.

The imageable element according to the present invention is thermally imageable. Upon such imaging the developer solubility of the imaged area is decreased to allow differentiation between imaged and non-imaged areas upon development. Typically, the step of exposing the imageable element to thermal radiation is carried out using an infrared laser. However, other methods such as visible or UV laser imaging may also be used, provided that a photoconverter, i.e., a photothermal converter, is present. Thus, for exposure with such visible or UV radiation sources, the imageable composition generally includes a photothermal converting material. Alternatively, the imageable element of the present invention can be imaged using a conventional apparatus containing a thermal printing head or any other means for imagewise conductively heating the imageable composition, such as, with a heated stylus or with a heated stamp.

The aqueous developer composition is dependent on the nature of the graft copolymer composition. Common components of aqueous developers include surfactants, chelating agents, such as salts of ethylenediamine tetraacetic acid, organic solvents, such as benzyl alcohol, and alkaline components, such as, inorganic metasilicates, organic metasilicates, hydroxides and bicarbonates. The pH of the aqueous developer is preferably within about 5 to about 14, depending on the nature of the graft copolymer composition.

Following development, a postbake may optionally be used to increase press life.

In addition to the thermally imageable layer, the thermally imageable element can have additional layers, such as, an underlying layer. Possible functions of an underlying layer include:

(1) to enhance developability of the imagewise unexposed areas; and (2) to act as a thermal insulating layer for the imagewise exposed areas.

Such a thermal insulating polymeric layer prevents otherwise rapid heat dissipation, for example, through the heat conducting aluminum substrate. This allows more efficient thermal imaging throughout the thermally imageable layer, particularly in the lower sections. In accordance with these functions, the underlying layer should be soluble or at least dispersible in the developer and, preferably, have a relatively low thermal conductivity coefficient.

The thermally imageable element can further have an overlying layer. Possible functions of an overlying layer include:

(1) to prevent damage, such as scratching, of the surface layer during handling prior to imagewise exposure; and (2) to prevent damage to the surface of the imagewise exposed areas, for example, by over-exposure which could result in partial ablation. The overlying layer should be soluble, dispersible or at least permeable to the developer.

The invention is further described in the following examples, which are intended to be illustrative and not limiting.

EXAMPLE 1

Synthesis of Graft Monomer Macromer 1

Toluene (25 g) was charged into a 500 mL flask, equipped with a Dean Stark trap filled with toluene, followed by the addition of poly ethylene glycol, monomethyl ether (PEGME) (225 g), MW 2000, in a $N_2$ atmosphere. The reaction mixture was heated to 110° C. and held at this temperature for 2 hr to remove any water by azeotropic distillation. Subsequently, the mixture was cooled to 70° C. and dibutyl tin dilaurate (0.225 g) was added, followed by the addition of m-isopropenyl-α, α-dimethylbenzyl isocyanate (23.6 g) (m-TMI, from Cytec Industries, West Patterson, N.J.) over a 30 min period at 70° C. After an additional 2 hr at 70° C., the reaction was completed, as evidenced by the disappearance of the NCO group, as determined by titration and FT-IR analysis. Subsequently, the solution was poured into a glass tray, resulting in a waxy solid material after 1 day. This material was dissolved in methyl ethyl ketone (300 g), followed by the addition of petroleum ether (2000 g), which resulted in the precipitation of solid macromer 1, which was collected by filtration and dried in vacuum oven at room temperature.

The reaction sequence is illustrated below:

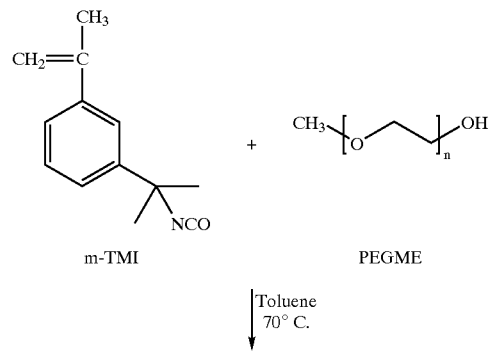

-continued

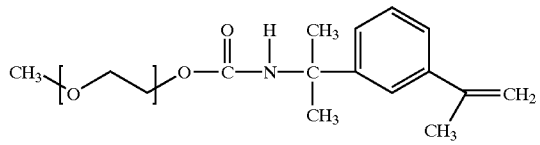

PEGME-Macromer

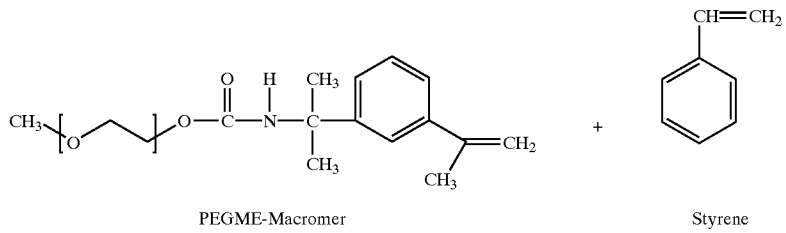

PEGME-Macromer      Styrene

| Vazo-64
| 80–85° C.
| H2O/n-Propanol (20:80)

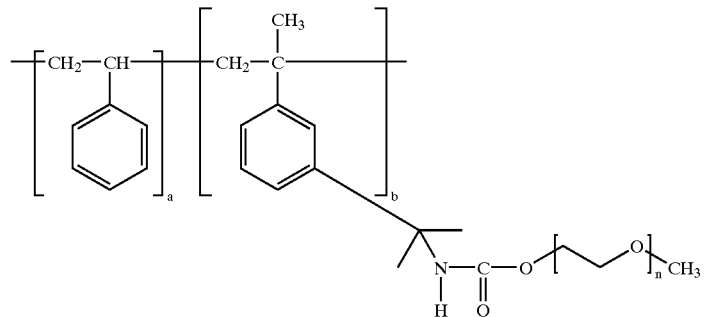

EXAMPLE 2
Synthesis of Graft Copolymer 1

A solution of macromer 1 (7.5 g), dissolved in a mixture of water (48 g) and 1-propanol (192 g), was charged into a 500-mL flask, which was heated to 80° C. Styrene (66.9 g) and azo bis-isobutyronitrile (0.48 g) (Vazo-64, from DuPont de Nemours Co) were mixed in a separate beaker and part of this solution (12 g) was added to the macromer solution, which became hazy within about 10 minutes. Subsequently, the remaining solution was added over a 30-min period. After 3 additional hr, the conversion to graft copolymer 1 was about 97% based on determination of % non-volatiles. The weight ratio of styrene:macromer 1 was about 90:10 in graft copolymer 1.

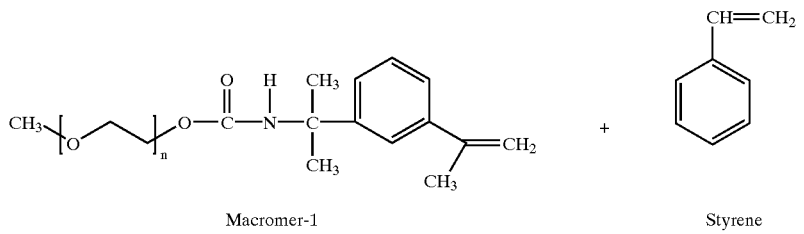

Macromer-1      Styrene

| Vazo-64

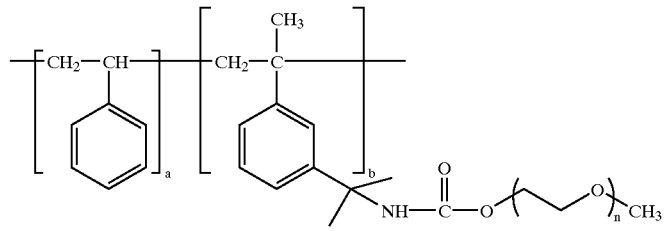

EXAMPLE 3

Synthesis of Graft Copolymers 2 through 7

Graft copolymers 2 through 7 were synthesized according to the procedure for graft copolymer 1, except that the weight ratio of styrene to macromer 1 in graft copolymers 2–7 was 90.5:9.5; 95:5; 97.5:2.5; 98.75:1.25; 80:20 and 85:15, respectively.

EXAMPLE 4

Plate Evaluation of Graft Copolymer 2

A solution of graft copolymer 2 (29.6 g) and IR-830 dye (1.2 g) (from ADS Corp), dissolved in a solvent mixture (69.2 g) of 1-propanol (27.7 g), ethanol (19 g), 2-methoxyethanol (17.3 g) and 1-butanol (5.2 g), was spin coated onto an electrochemically-grained, sulfuric acid anodized, silicated aluminum substrate A to provide a coating weight of 2 g/m². The same solution was also spin coated onto a pumice-grained, phosphoric acid anodized aluminum substrate B to provide the same coating weight of 2 g/m². Both plates were exposed utilizing a Creo Trendsetter 3244 imagesetter at 240 mJ/cm², developed with developer 956 (available from Kodak Polychrome Graphics) to which 5% propylene glycol phenyl ether had been added.

Following development, one set of plates with substrates A and B were post-baked at 200° C. for 3 min; a second set of plates with substrates A and B were not post-baked. The baked and unbaked plates were mounted on an OMCSA H-125 press. All plates provided clean impressions on press. The post-baked plate prepared with substrate B provided 50,000 impressions without any loss of image.

EXAMPLE 5

Synthesis of Graft Monomer Macromer 2

Toluene (266 g) was charged into a 500-mL flask, followed by the addition of poly (ethyleneglycol monomethyl ether) (80 g) (MW 2000) and methacroyl chloride (4.2 g) in a $N_2$ atmosphere. Subsequently, triethylamine (4.52 g) was added over a period of 20, while maintaining the reaction temperature at 30° C. After an additional 2 hr, the temperature of the reaction mixture was raised to 50° C. and kept at that temperature for an additional 2 hr. Subsequently, the reaction mixture was cooled to room temperature and filtered to remove the triethylamine hydrochloride salt, which was obtained in the theoretical amount. Petroleum ether was added to the filtrate to precipitate macromer 2, which was collected by filtration and dried in vacuum oven at room temperature.

EXAMPLE 6

Synthesis of Graft Copolymer 8

Graft copolymer 8 was prepared in the same manner as graft copolymer 1, except that macromer 2 was used in place of macromer 1. The weight ratio of styrene:macromer 2 was about 90:10 in graft copolymer 8.

EXAMPLE 7

Plate Evaluation of Graft Copolymer 8

Substrates A and B were coated, exposed and developed in accordance with the procedures in example 4, except that graft copolymer 8 was used in place of graft copolymer 2. As in example 4, both baked and unbaked plates were mounted on the OMCSA H-125 press. The baked and unbaked plates were mounted on an OMCSA H-125 press. All plates provided clean impressions on press. The post-baked plate prepared with substrate B provided 90,000 impressions without any loss of image.

EXAMPLE 8

Plate Evaluation of Graft Copolymer 8 Together with Binder Resin

Substrate A was coated, exposed and developed in accordance with the procedures of Example 7, except that graft copolymer 8 and acrylic binder ACR-1412 (described below) were used in place of graft copolymer 8 by itself. Graft copolymer 8 and ACR-1412 were used in the weight ratio, based on solids, of about 80:20. Following development, one of the plates was directly mounted on an OMCSA H-125 press. Another of the developed plates was post-baked at 200° C. for 3 min prior to being mounting on the OMCSA H-125 press. The unbaked plate provided about 35,000 clean impressions before any loss of image. Under the same conditions, the post-baked plate provided about 50,000 clean impressions without any loss of image.

Acrylic Resin ACR-1412 was Prepared as Follows

A mixture of methyl methacrylate (19.1 g), methacrylic acid (3.3 g), ethyl acrylate (2.5 g), azoisobutyronitrile (0.5 g) and dodecylmercaptan (0.09 g) was heated at 80° C. in 2-methoxyethanol (153 g) under nitrogen, in a reaction vessel equipped with a dropping funnel and reflux condenser. Subsequently, a mixture of methyl methacrylate (57.4 g), methacrylic acid (10.2 g), ethyl acrylate (7.5 g), azoisobutyronitrile (1 g) and dodecylmercaptan (0.19 g) was added over a period of 2 hrs, followed by additional azoisobutyronitrile (0.25 g). After heating at 80° C. for 2 hrs, more azoisobutyronitrile (0.25 g) was added, follow by heating for an additional 2 hrs, after which the reaction was allowed to cool to room temperature. The acid number of the terpolymer of methyl methacrylate, methacrylic acid and ethyl acrylate was 88.

EXAMPLE 9

Synthesis of Graft Monomer Macromer 3

Tricosa (ethyleneglycol), dodecyl ether (94.1 g) (0.625 equivalents) (Brij-35P, available from Fluka), methacrolylchloride (6.54 g) (0.0625 equivalents) and triethylamine (TEA) (7.01 g) (0.0687 equivalents) were added in turn to a 1 liter flask charged with toluene (323 g). The addition was carried out under a $N_2$ atmosphere and over a period of 20 min, while the temperature was maintained at 30° C. After 2 hr, the temperature was raised to 50° C. and kept at that temperature for two additional hours, after which the reaction mixture was cooled to room temperature and filtered to remove the triethylamine hydrochloride salt. The mother liquor was added to petroleum ether (b.p. 60–80° C.) to precipitate the macromer, which was filtered and dried under vacuum at room temperature. The solid methacrylated macromer 3, having both hydrophilic and hydrophobic segments, was obtained in about 78% yield (see below).

EXAMPLE 12

Dynamic Contact Angle Determinations

Dynamic contact angles were determined for films of (1) graft copolymer 8 on substrate B, (2) acrylic resin binder ACR-1412 on substrate A, (3) an 80:20 mixture of graft copolymer 8 and ACR-1412 on substrate A and (4) graft copolymer 9, coated on substrate B. The films also contained IR-830 dye (about 15 wt %). Dynamic contact angle measurements were made using a VCA 2000 Video Contact Angle System (from AST Inc). In each case, about 2 μl of deionized water was applied onto the surface of the film, using a microsyringe. The video of the droplet was recorded at 5 frames/sec for 10 sec. Contact angles were calculated

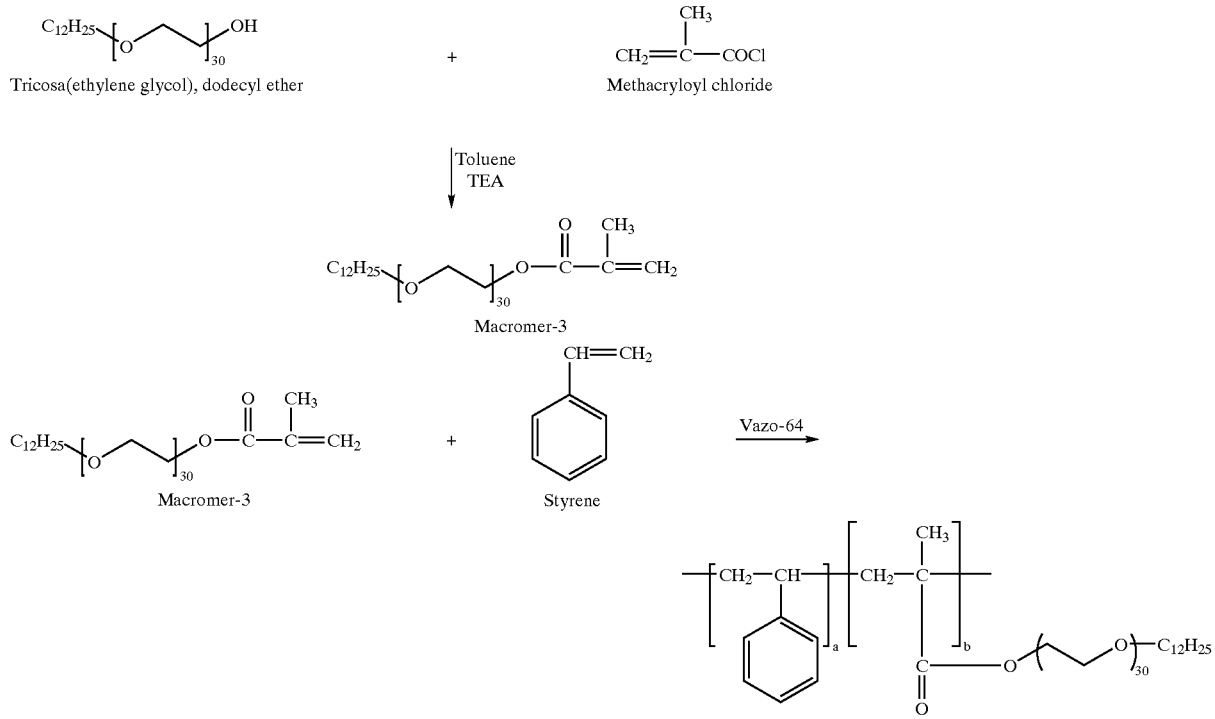

EXAMPLE 10

Synthesis of Graft Copolymer 9

Macromer 3 (12.5 g) was added under $N_2$ to a mixture of distilled water (30 g) and 1-propanol (120 g) in a 500 mL round bottom flask and the temperature was raised to 80° C. A mixture of styrene (37.2 g) and Vazo-64 (0.3 g) was added in 2 portions: first, 6 g of the mixture; after 30 min, the rest of the mixture was added over a 2 hr period. Additional Vazo-64 (0.3 g) was added and the mixture was allowed to react for an additional 7 hr, after which time 98% of the theoretical amount of product, based on non-volatiles, was achieved. The weight ratio of styrene:macromer 3 was about 75:25 in graft copolymer 9.

EXAMPLE 11

Preparation of a Printing Plate Utilizing Graft Copolymer 9

Substrate B was coated, exposed and developed in accordance with the procedures of Example 4, except that graft copolymer 9 was used in place of graft copolymer 2. An ink receptive image was obtained, which exhibited an ink-free background.

and plotted as a function of time. Dynamic contact angles of films of graft copolymer 8, before and after exposure/development, were about 80 and 85, respectively. Corresponding contact angles of acrylic resin binder ACR-1412, before and after exposure/development, were both about 70. Corresponding contact angles of an 80:20 mixture of graft copolymer 8 and ACR-1412, before and after exposure/development, were about 60 and 90, respectively. Corresponding contact angles of graft copolymer 9, before and after exposure/development, were about 20 and 70, respectively. The latter experiment demonstrates that the surface of graft copolymer 9 is substantially more polar, based on contact angle measurements, relative to the surface of the acrylic resin binder ACR-1412. The thermally imageable composition of the present invention is useful in digital imaging applications, including printing plates and printed circuit boards. The composition can be utilized as a single layer digital recording medium for heat sensitive resists or printing plates.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. An imageable element comprising:

a substrate;

a thermally imageable composition coated on a surface of said substrate;

wherein said thermally imageable composition comprises a graft copolymer having a hydrophobic polymer backbone and a plurality of pendant groups represented by the formula:

—Q—W—Y wherein Q is a difunctional connecting group;
W is selected from the group consisting of:
a hydrophilic segment and a hydrophobic segment;
Y is selected from the group consisting of:
a hydrophilic segment and a hydrophobic segment;
with the proviso that when W is a hydrophilic segment,
Y is selected from the group consisting of:
a hydrophilic segment and a hydrophobic segment, with the further proviso that when W is hydrophobic, Y is a hydrophilic segment; and
a material that is capable of converting electromagnetic radiation into heat.

2. The imageable element of claim 1, wherein said hydrophobic polymer backbone is an all carbon backbone.

3. The imageable element of claim 1, wherein said graft copolymer is a co-polymer derived from:

a polymerizable monomer represented by the formula:

$CH_2=C(R^1)$—Q—W—Y wherein $R^1$ is selected from the group consisting of:
H, alkyl, aryl, aralkyl, alkaryl, ester, acyl, halogen and cyano;
and Q, W and Y have the same meaning as above; and
a comonomer represented by the formula:

$CH_2=C(R^2)$—Z wherein $R^2$ is selected from the group consisting of:
H, alkyl, aryl, aralkyl, alkaryl, ester, acyl, halogen and cyano;
and Z is selected from the group consisting of:
H, alkyl, halogen, cyano, acyloxy, alkoxy, alkoxycarbonyl, hydroxyalkyloxycarbonyl, acyl, aminocarbonyl, aryl and substituted aryl.

4. The imageable element of claim 1, wherein said graft copolymer has a Number Average Molecular Weight of from about 2,000 to about 2,000,000.

5. The imageable element of claim 1, wherein each of said pendant —Q—W—Y groups in said graft copolymer has a Number Average Molecular Weight of from about 200 to about 10,000.

6. An imageable element comprising:

a substrate;

a thermally imageable composition coated on a surface of said substrate;

wherein said thermally imageable composition comprises a graft polymer having a hydrophobic polymer backbone and a plurality of pendant groups represented by the formula:

—Q—W—Y wherein Q is a difunctional connecting group;
W is selected from the group consisting of:
a hydrophilic segment and a hydrophobic segment;
Y is selected from the group consisting of:
a hydrophilic segment and a hydrophobic segment;
with the proviso that when W is a hydrophilic segment,
Y is selected from the group consisting of:
a hydrophilic segment and a hydrophobic segment, with the further proviso that when W is hydrophobic, Y is a hydrophilic segment;
wherein said graft polymer is a homopolymer derived from a polymerizable monomer represented by the formula:

$CH_2=C(R^1)$—Q—W—Y wherein $R^1$ is selected from the group consisting of:
H, alkyl, aryl, aralkyl, alkaryl, ester, acyl, halogen and cyano;
and Q, W and Y have the same meaning as above;
and a material that is capable of converting electromagnetic radiation into heat.

7. An imageable element comprising:

a substrate;

a thermally imageable composition coated on a surface of said substrate;

wherein said thermally imageable composition comprises a graft copolymer comprising repeating units represented by the formula:

$$\left[ -(CH_2-\underset{\underset{\underset{Y}{|}}{\underset{W}{|}}}{\overset{R^1}{\underset{|}{C}}})_j-(CH_2-\underset{Z}{\overset{R^2}{\underset{|}{C}}})_k- \right]_m$$

wherein each of $R^1$ and $R^2$ is independently selected from the group consisting of:
H, alkyl, aryl, aralkyl, alkaryl, halogen and cyano;
Q is selected from the group consisting of:

$$-\overset{O}{\underset{\|}{C}}-OCH_2CH(OH)CH_2-, \quad -\overset{O}{\underset{\|}{C}}-NR^2-CH_2-;$$

[benzene ring with $R^4$ substituent]$-CH_2-$ $\quad -\overset{O}{\underset{\|}{C}}-NR^3-CH_2CH_2-;$ $-\overset{O}{\underset{\|}{C}}-;$ [benzene ring with $R^4$]; and [benzene ring with $CH_3$, $CH_3$, C, O, NHC—];

wherein $R^3$ is selected from the group consisting of:
H and alkyl;
$R^4$ is selected from the group consisting of:
H, alkyl, halogen, cyano, nitro, alkoxy, alkoxycarbonyl, acyl and a combination thereof;

W is selected from the group consisting of:
   a hydrophilic segment and a hydrophobic segment;
Y is selected from the group consisting of:
   a hydrophilic segment and a hydrophobic segment;
Z is selected from the group consisting of:
   H, alkyl, halogen, cyano, acyloxy, alkoxy, alkoxycarbonyl, hydroxyalkyloxycarbonyl, acyl, aminocarbonyl, aryl and substituted aryl;
is at least 1;
k is at least 1; and
m is at least 2;
with the proviso that when W is a hydrophilic segment,
   Y is selected from the group consisting of:
      a hydrophilic segment and a hydrophobic segment, with the further proviso that when W is hydrophobic, Y is a hydrophilic segment;
   and a material that is capable of converting electromagnetic radiation into heat.

8. The imageable element of claim 7, wherein said graft copolymer has a glass transition temperature of at least 40° C.

9. The imageable element of claim 8, wherein said glass transition temperature is from about 50 to about 150° C.

10. The imageable element of claim 7, wherein said graft copolymer comprises repeating units represented by the formula:

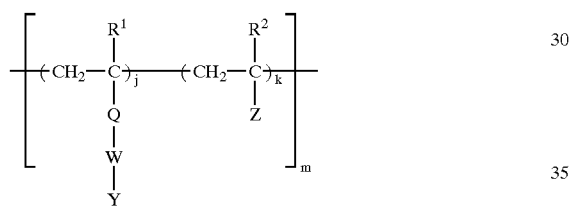

wherein each of $R^1$ and $R^2$ is independently selected from the group consisting of:
   H, alkyl, aryl, aralkyl, alkaryl, halogen and cyano;
Q is selected from the group consisting of:

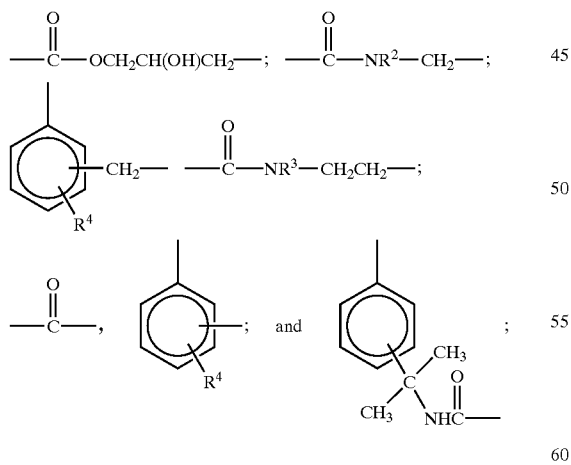

wherein $R^3$ is selected from the group consisting of:
   H and alkyl;
$R^4$ is selected from the group consisting of:
   H, alkyl, halogen, cyano, nitro, alkoxy, alkoxycarbonyl, acyl and a combination thereof;
W is selected from the group consisting of:
   a hydrophilic segment and a hydrophobic segment, wherein said hydrophilic segment is selected from the group consisting of a segment represented by the formula:

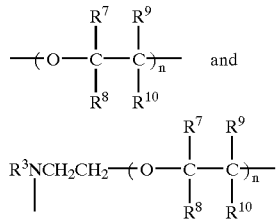

wherein each of $R^7$, $R^8$, $R^9$ and $R^{10}$ is independently selected from the group consisting of:
   H and methyl;
$R^3$ is selected from the group consisting of:
   H and alkyl;
and wherein said hydrophobic segment is selected from the group consisting of:
   —$R^{12}$—, —O—$R^{12}$—O—, —$R^3$N —$R^{12}$—$NR^3$—, —OOC—$R^{12}$—O— and —OOC—$R^{12}$—O—,
   wherein each $R^{12}$ is independently selected from the group consisting of:
   a linear, branched or cyclic alkylene of 6–120 carbon atoms, a haloalkylene of 6–120 carbon atoms, an arylene of 6–120 carbon atoms, an alkarylene of 6–120 carbon atoms and an aralkylene of 6–120 carbon atoms
$R^3$ is selected from the group consisting of:
   H and alkyl;
Y is selected from the group consisting of:
   a hydrophilic segment and a hydrophobic segment, wherein said hydrophilic segment is selected from the group consisting of:
   H, $R^{15}$, OH, $OR^{15}$, COOH, $COOR^{16}$, $O_2CR^{16}$, a segment represented by the formula:

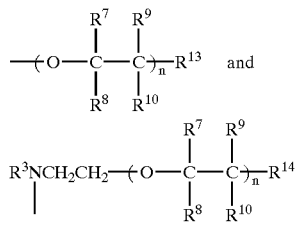

wherein each of $R^7$, $R^8$, $R^9$ and $R^{10}$ is independently selected from the group consisting of:
   H and methyl;
$R^3$ is selected from the group consisting of:
   H and alkyl;
wherein each $R^{13}$ $R^{14}$, $R^{15}$ and $R^{16}$ is independently selected from the group consisting of:
   H and alkyl of 1–5 carbon atoms and
wherein said hydrophobic segment is selected from the group consisting of:
   a linear, branched or cyclic alkyl of 6–120 carbon atoms, a haloalkyl of 6–120 carbon atoms, an aryl of 6–120 carbon atoms, an alkaryl of 6–120 carbon atoms, an aralkyl of 6–120 carbon atoms, $OR^{17}$, $OOCR^{17}$ and $O_2OR^{17}$,
wherein $R^{17}$ is an alkyl of 6–20 carbon atoms;

Z is selected from the group consisting of:
H, alkyl, halogen, cyano, acyloxy, alkoxy, alkoxycarbonyl, hydroxyalkyloxycarbonyl, acyl, aminocarbonyl, aryl and substituted aryl;
is at least 1;
k is at least 1
m is at least 2; and
n is from about 5 to about 250;
with the proviso that when W is a hydrophilic segment, Y is selected from the group consisting of:
a hydrophilic segment and a hydrophobic segment, with the further proviso that when W is hydrophobic, Y is a hydrophilic segment.

11. The imageable element of claim 10, wherein the substituent in said substituted aryl is selected from the group consisting of:
alkyl, halogen, cyano, alkoxy and alkoxycarbonyl.

12. The imageable element of claim 11, wherein each alkyl is independently selected from the group consisting of:
alkyl of 1 to 22 carbon atoms.

13. The imageable element of claim 10, wherein W—Y is represented by the formula:

$$-(OCH_2CH_2)_n-OCH_3$$

wherein n is from about 10 to about 75.

14. The imageable element of claim 10, wherein said graft copolymer comprises repeating units represented by the formula:

$$\left[ +CH_2-\underset{\underset{(OCH_2CH_2)_n-OCH_3}{\overset{O=C}{|}}}{\overset{CH_3}{\underset{|}{C}}}\!\!+_j\;\;+CH_2-\overset{H}{\underset{|}{C}}+_k \right]_m$$

wherein j and are each at least 1;
m is at least 5;
and n is from about 10 to about 75.

15. The imageable element of claim 14, wherein n has an average value of about 45.

16. The imageable element of claim 7, wherein said graft copolymer has a Number Average Molecular Weight of from about 2,000 to about 2,000,000.

17. The imageable element of claim 7, wherein said thermally imageable composition further comprises a binder.

18. The imageable element of claim 7, wherein said thermally imageable composition is free of a binder.

19. The imageable element of claim 7, further comprising an underlying layer.

20. The imageable element of claim 7, further comprising an overlying layer.

21. An imageable element comprising a graft copolymer comprising repeating units represented by the formula:

$$\left[ +CH_2-\overset{CH_3}{\underset{|}{C}}+_j\;\;+CH_2-\overset{H}{\underset{|}{C}}+_k \right]_m$$

with pendant $-C(CH_3)_2-NHC(O)-(OCH_2CH_2)_n-OCH_3$ wherein j and k are each at least 1;
m is at least 5;
and n is from about 10 to about 75.

22. The imageable element of claim 21, wherein n has an average value of about 45.

23. The imageable element of claim 21, wherein said graft copolymer has a Number Average Molecular Weight of from about 2,000 to about 2,000,000.

24. A method of producing an imaged element comprising the steps of:
providing an imageable element comprising:
a substrate;
and a thermally imageable composition coated on a surface of said substrate;
said thermally imageable composition comprising a graft copolymer having a hydrophobic polymer backbone and a plurality of pendant groups represented by the formula:

$$-Q-W-Y$$

wherein Q is a difunctional connecting group;
W is selected from the group consisting of:
a hydrophilic segment and a hydrophobic segment;
Y is selected from the group consisting of:
a hydrophilic segment and a hydrophobic segment;
with the proviso that when W is a hydrophilic segment, Y is selected from the group consisting of:
a hydrophilic segment and a hydrophobic segment, with the further proviso that when W is hydrophobic, Y is a hydrophilic segment;
imagewise exposing said imageable element to thermal radiation to produce exposed and unexposed regions; and
contacting said imagewise exposed imageable element and a developer to remove said unexposed regions and thereby produce said imaged element.

25. The method of claim 24, wherein said graft copolymer comprises repeating units represented by the formula:

$$\left[ +CH_2-\underset{\underset{\underset{Y}{\overset{|}{W}}}{\overset{|}{Q}}}{\overset{R^1}{\underset{|}{C}}}+_j\;\;+CH_2-\overset{R^2}{\underset{\underset{}{\overset{|}{Z}}}{\underset{|}{C}}}+_k \right]_m$$

wherein each R$^1$ and R$^2$ is independently selected from the group consisting of:
H, alkyl, aryl, aralkyl, alkaryl, halogen and cyano;
Q is selected from the group consisting of:

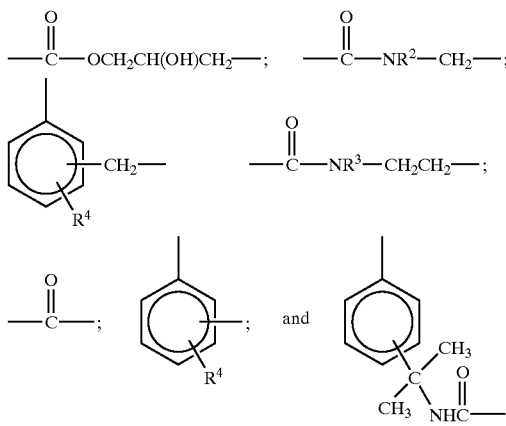

wherein R$^3$ is selected from the group consisting of:
H and alkyl;
R$^4$ is selected from the group consisting of:
H, alkyl, halogen, cyano, nitro, alkoxy, alkoxycarbonyl, acyl and a combination thereof;
W is selected from the group consisting of:
a hydrophilic segment and a hydrophobic segment;
Y is selected from the group consisting of:
a hydrophilic segment and a hydrophobic segment;
Z is selected from the group consisting of:
H, alkyl, halogen, cyano, acyloxy, alkoxy, alkoxycarbonyl, hydroxyalkyloxycarbonyl, acyl, aminocarbonyl, aryl and substituted aryl;
j is at least 1;
k is at least 1; and
m is at least 2;
with the proviso that when W is a hydrophilic segment, Y is selected from the group consisting of:
a hydrophilic segment and a hydrophobic segment, with the further proviso that when W is hydrophobic, Y is a hydrophilic segment.

26. The method of claim 24, wherein said step of exposing said imageable element to thermal radiation is carried out using an infrared laser.

27. The method of claim 24, further comprising postbaking said imaged element.

28. The method of claim 24, wherein said developer for removing said unexposed regions is an aqueous developer.

29. A thermally imageable composition comprising:
a graft copolymer having a hydrophobic polymer backbone and a plurality of pendant groups represented by the formula:

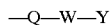

wherein Q is a difunctional connecting group;
W is selected from the group consisting of:
a hydrophilic segment and a hydrophobic segment;
Y is selected from the group consisting of:
a hydrophilic segment and a hydrophobic segment;
with the proviso that when W is a hydrophilic segment,
Y is selected from the group consisting of:
a hydrophilic segment and a hydrophobic segment, with the further proviso that when W is hydrophobic, Y is a hydrophilic segment; and a material that is capable of converting electromagnetic radiation into heat.

30. The thermally imageable composition of claim 21, wherein said graft copolymer comprises repeating units represented by the formula:

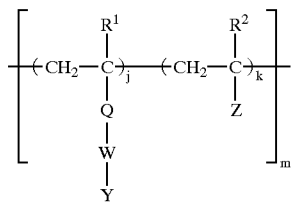

wherein each of R$^1$ and R$^2$ independently selected from the group consisting of:
H, alkyl, aryl, aralkyl, alkaryl, halogen and cyano;
is selected from the group consisting of:

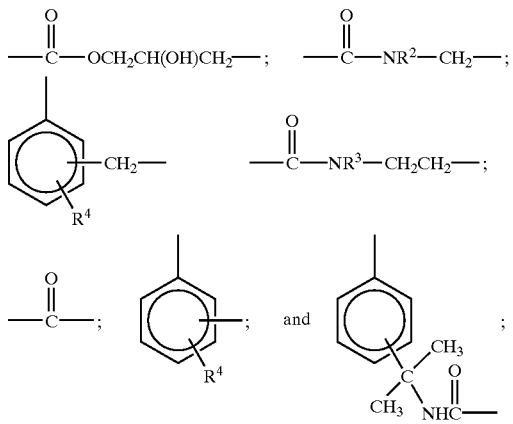

wherein R$^3$ is selected from the group consisting of:
H and alkyl;
R$^4$ is selected from the group consisting of:
H, alkyl, halogen, cyano, nitro, alkoxy, alkoxycarbonyl, acyl and a combination thereof
W is selected from the group consisting of:
a hydrophilic segment and a hydrophobic segment;
Y is selected from the group consisting of:
a hydrophilic segment and a hydrophobic segment;
Z is selected from the group consisting of:
H, alkyl, halogen, cyano, acyloxy, alkoxy, alkoxycarbonyl, hydroxyalkyloxycarbonyl, acyl, aminocarbonyl, aryl and substituted aryl;
j is at least 1;
k is at least 1; and
m is at least 2
with the proviso that when W is a hydrophilic segment, Y is selected from the group consisting of:
a hydrophilic segment and a hydrophobic segment, with the further proviso that when W is hydrophobic, Y is a hydrophilic segment.

* * * * *

UNITED STATES PATENT AND TRADEMARK OFFICE
CERTIFICATE OF CORRECTION

PATENT NO.    : 6,582,882 B2                                    Page 1 of 1
DATED         : June 24, 2003
INVENTOR(S)   : Socrates Peter Pappas et al.

It is certified that error appears in the above-identified patent and that said Letters Patent is hereby corrected as shown below:

Column 23,
Line 9, -- j -- should be inserted before "is at least 1".

Column 24,
Line 39, "$OR^{15}$" should be -- $OR^{16}$ --.
Line 66, "$OOCR^{17}$" should be -- $COOR^{17}$ --.
Line 67, "$O^2OR^{17}$" should be -- $O_2CR^{17}$ --.

Column 25,
Line 5, -- j -- should be inserted before "is at least 1".
Line 49, after the formula, -- k -- should be inserted after "wherein j and".

Column 27,
Line 1, -- of -- should be inserted after "wherein each".

Column 28,
Line 3, "21" should be -- 29 --.
Line 20, before the second formula. -- Q -- should be inserted before "is selected from the group consisting of:"

Signed and Sealed this

Eighteenth Day of November, 2003

JAMES E. ROGAN
*Director of the United States Patent and Trademark Office*